United States Patent [19]
Hashimoto et al.

[11] Patent Number: 5,811,153
[45] Date of Patent: Sep. 22, 1998

[54] COATING SOLUTIONS FOR USE IN FORMING BISMUTH-BASED DIELECTRIC THIN FILMS, AND DIELECTRIC THIN FILMS AND MEMORIES FORMED WITH SAID COATING SOLUTIONS, AS WELL AS PROCESSES FOR PRODUCTION THEREOF

[75] Inventors: Akira Hashimoto; Yoshihiro Sawada, both of Kanagawa-ken; Tetsuya Osaka, Tokyo; Ichiro Koiwa, Tokyo; Juro Mita, Tokyo; Takao Kanehara, Tokyo, all of Japan

[73] Assignee: Tokyo Ohka Kogyo Co., Ltd., Kanagawa-ken, Japan

[21] Appl. No.: 837,478

[22] Filed: Apr. 18, 1997

[30] Foreign Application Priority Data

Apr. 19, 1996 [JP] Japan ................................. 8-122565

[51] Int. Cl.$^6$ ................................. B05D 5/12; B05D 3/02
[52] U.S. Cl. ................... 427/58; 427/126.3; 427/226; 427/383.3; 106/1.12; 106/1.25; 106/287.19; 106/287.35
[58] Field of Search ....................... 427/58, 126.3, 427/226, 383.3; 106/286.6, 287.19, 287.35, 1.12, 1.22, 1.25

[56] References Cited

U.S. PATENT DOCUMENTS

| | | | |
|---|---|---|---|
| 4,579,594 | 4/1986 | Nanao et al. | 106/287.24 |
| 4,668,299 | 5/1987 | Nanao et al. | 106/309 |
| 4,908,065 | 3/1990 | Tanitsu et al. | 106/287.24 |
| 5,593,495 | 1/1997 | Masuda et al. | 117/4 |
| 5,645,634 | 7/1997 | Ogi et al. | 106/287.19 |

FOREIGN PATENT DOCUMENTS

| | | |
|---|---|---|
| 8-91841 | 4/1986 | Japan . |
| 61-86423 | 5/1986 | Japan . |
| 5-298920 | 11/1993 | Japan . |
| 9-77592 | 3/1997 | Japan . |

OTHER PUBLICATIONS

Atsuki et al, Jpn Jour. Applied Physics, vol. 34, Sep. 1995, pp. 5096–5099.

Proceeding of the 12th Ferroelectric Materials and their Application meeting in May 24–27, 1995. Paper presented by Mitsubishi Materials Co. central Research Institute, 24–TP–11, pp. 57–58; and Paper presented by Olympus Optical Co., Ltd. and Symetrix Corporation, 26–T–C, pp. 139–140.

"Report of the workshop on Applied Electronics Properties," The Japan Society of Applied Physics, pp. 1–8, Nov. 22, 1994.

"Ceramics," vol. 30, No. 6, pp. 499–507, 1995.

*Primary Examiner*—Michael Lusignan
*Assistant Examiner*—Fred J. Parker
*Attorney, Agent, or Firm*—Wenderoth, Lind & Ponack, L.L.P.

[57] ABSTRACT

Alkoxymetals, β-diketones or metal acetates which are metal compounds corresponding independently to Bi, metallic element A (which is at least one member of the group consisting of Ca, Ba, Sr, Pb and Bi) and metallic element B (which is at least one member of the group consisting of Ti, Nb and Ta) are reacted with alcohols, carboxylic anhydrides, glycols, β-diketones or dicarboxylic acid monoesters to prepare compounds for inclusion in coating solutions for use in forming Bi-based dielectric thin films. The coating solutions are used to produce dielectric thin films or memories.

17 Claims, 2 Drawing Sheets

COATING SOLUTIONS FOR USE IN FORMING BISMUTH-BASED DIELECTRIC THIN FILMS, AND DIELECTRIC THIN FILMS AND MEMORIES FORMED WITH SAID COATING SOLUTIONS, AS WELL AS PROCESSES FOR PRODUCTION THEREOF

BACKGROUND OF THE INVENTION

1. Field of the Invention

This invention relates to coating solutions for use in forming Bi-based dielectric thin films, and dielectric thin films and memories formed with said coating solutions, as well as processes for production thereof. More specifically, the invention relates to coating solutions that are capable of forming dense Bi-based dielectric thin films without cracks and which have good keeping quality; the invention also relates to dielectric thin films and memories formed with such coating solutions, as well as processes for the production thereof.

2. Description of Relevant Art

Thin films of bismuth layer-structured ferroelectrics (BLSF) represented by the general formula $(Bi_2O_2)^{2+}(A_{m-1}B_mO_{3m+1})^{2-}$ [where A is a mono-, di- or trivalent ion (as of a metallic element like Bi, Pb, Ba Sr or Ca) or combinations of these ions; B is a tetra-, penta- or hexavalent ion (as of a metallic element like Ti, Nb or Ta) or combinations of these ions; m is an integer of 1–5] have recently been found to feature good characteristics such as requiring small coercive field (Ec) in remanent polarization (Pr)-Ec hysteresis curves and hence experiencing less fatigue as a result of repeated polarization switching. This has spotlighted the potential use of BLSF thin films as materials for the fabrication of semiconductor memories (T. Takenaka, "Bismuth Layer-Structured Ferroelectrics and Their Grain Orientation" in Report of the Workshop on Applied Electronics Properties, The Japan Society of Applied Physics, pp. 1–8, Nov. 22, 1994; and "Ceramics", vol. 30, No. 6, pp. 499–507, 1995). Among the BLSF thin films so far reported, those of a $SrBi_2Ta_2O_9$ system which are represented by the formula $(Bi_2O_2)^{2+}(SrTa_2O_7)^{2-}$ are of particular interest since the desired characteristics are conspicuous in them.

Such BLSF thin films can be formed by various methods including sputtering, CVD and coated film formation. However, due to the many metal oxides that have to be incorporated as constituents, sputtering and CVD techniques require costly apparatus and considerable difficulties are involved in controlling the composition of ferroelectric thin films at desired levels; hence, these techniques are not suitable for practical applications, particularly on large-diameter substrates. In contrast, the coated film formation technique does not need expensive apparatus and can deposit films at comparatively low cost; in addition, they provide ease in controlling the composition of ferroelectric thin films at desired levels. Therefore, the coated film process for the formation of BLSF thin films holds much promise for commercial use.

While several formulations have been proposed for use as coating solutions in the formation of BLSF thin films by the coated film process, two typical cases are those prepared by dissolving carboxylate (e. g. 2-ethylhexanate) of Sr and Bi and alkoxides of Ta in acetate esters (Proceeding of the 12th Ferroelectric Materials and their Applications meeting in May 24–27, 1995, Paper presented by Mitsubishi Materials Corporation, 24-TP-11, pp. 57–8; and "Jpn. J. Appl. Phys.", vol. 34, pp. 5096–5099, 1995) and those prepared by dissolving 2-ethylhexanate of Sr, Bi, Ta, Nb, Ti etc. in xylene to form coating solutions of a metallo-organic decomposition (MOD) type (Proceeding of the 12th Ferroelectric Materials and their Applications meeting in May 24–27, 1995, Paper presented by Olympus Optical Co., Ltd. and Symetrix Corporation, 26-TC-10, pp. 139–140). However, these coating solutions have had various problems. First, the 2-ethylhexanate of the respective metal components has a long-chain ($C_8$) organic group, so a large portion of the coating solution is occupied by the organic content and there is much loss in the coating weight due to the burning out of the organic content in the process of film formation consisting of the application of the coating solution, baking of the applied coating and crystallization and only a porous film will result. In addition, the surface morphology of coating film is not satisfactory enough to provide for easy application to the fabrication of VLSI devices. Further, in addition the applied coating has to be baked twice at an elevated temperature of 800° C. in order to ensure appropriate electrical characteristics but this is problematic from the viewpoint of semiconductor fabrication process.

The prior art coating solutions have further problems. The metal salt (metallic soaps) of long-chain monobasic carboxylic acids which are commonly used in the coating solutions are generally slightly soluble in polar solvents and, hence, aromatic solvents such as xylene and toluene are used to prepare the coating solutions. However, the coating solutions using such aromatic solvents have to be stored in glass or metallic containers in order to ensure that the evaporating solvents will not be lost to the ambient atmosphere. On the other hand, glass and metallic containers have the disadvantage that metallic components will dissolve out into the coating solution and this is by no means desirable in the art of semiconductor fabrication which hates contamination with metallic impurities. Under these circumstances, it is preferred to use polyethylene or polypropylene containers which release only negligible amounts of contaminating metallic impurities, which can be protected against mechanical shocks by simple handling procedures and which are less costly and it is desired to use solvents that will leak out of the plastic containers in negligibly small amounts.

The aforementioned aromatic solvents are also very toxic to humans and subject to increasingly rigorous regulations in the methods of use, management and so forth.

If the metal salts of monobasic long-chain carboxylic acids are replaced by metal salts of short-chain carboxylic acids, little solubility is achieved in practical organic solvents. Lower alkoxides of metals are soluble in several polar solvents but on account of the great tendency to be hydrolyzed with moisture in the air, they have only poor keeping quality and practically acceptable levels of reproduction cannot be achieved in the result of coating operations.

Under the circumstances, it has been strongly desired to develop a coating solution that is capable of forming highly dense films of good quality with minimal coating weight loss due to the burning of the organic matter in the coating solution and which is soluble in practical organic solvents and which have good keeping quality.

SUMMARY OF INVENTION

An object, therefore, of the present invention is to provide a coating solution that contains an organometallic compound soluble in practical organic solvents, that is capable of forming dense Bi-based dielectric thin films, that has good keeping quality and that assures highly reproducible results in coating operations.

Another object of the invention is to provide Bi-based dielectric thin films using the coating solution.

Yet another object of the invention is to provide a dielectric memory using the coating solution.

As a result of the intensive studies made in order to attain the stated objects, the present inventors found that coating solutions capable of forming Bi-based dielectric thin films and satisfying the requirements for improved solubility in practical organic solvents and better keeping quality could be obtained by reacting alkoxymetals, metal complexes or metal acetates of specified metals with alcohols, carboxylic anhydrides, glycols, β-diketones or dicarboxylic acid monoesters. The present invention has been accomplished on the basis of this finding.

Thus, in one of its aspects, the present invention relates to a coating solution for use in forming Bi-based dielectric thin films containing Bi, metallic element A (which is at least one member of the group Ca, Ba, Sr, Pb and Bi) and metallic element B (which is at least one member of the group consisting of Ti, Nb and Ta), further contains compounds prepared by reacting (a) at least one metal compound of Bi, at least one metal compound of metallic element A and at least one metal compound of metallic element B, said metal compounds being each independently in the form of either an alkoxymetal, a β-diketone metal complex or a metal acetate, with (b) at least one member of the group consisting of alcohols, carboxylic anhydrides, glycols, β-diketones and dicarboxylic acid monoesters.

In another aspect, the present invention relates to a dielectric thin film formed by applying said coating solution onto an electrode on a substrate and then baking the applied coating.

In yet another aspect, the present invention relates to a dielectric memory fabricated by forming a top electrode on said dielectric thin film.

In a further aspect, the present invention relates to a process for producing a dielectric thin film by the steps of (I) forming an electrode over a substrate, (II) applying a coating solution onto said electrode and (III) baking the applied coating, wherein said coating solution contains compound prepared by reacting (a) at least one metal compound of Bi, at least one metal compound of metallic element A (as defined above) and at least one metal compound of metallic element B (as defined above), said metal compounds being each independently in the form of either an alkoxymetal, a β-diketone metal complex or a metal acetate, with (b) at least one member of the group consisting of alcohols, carboxylic anhydrides, glycols, β-diketones and dicarboxylic acid monoesters.

In a still further aspect, the present invention relates to a process for producing a dielectric memory by the steps of (I) forming an electrode over a substrate, (II) applying a coating solution onto said electrode, (III) baking the applied coating to form a dielectric thin film and (IV) forming a top electrode over said dielectric thin film, wherein said coating solution contains compounds prepared by reacting (a) at least one metal compound of Bi, at least one metal compound of metallic element A (as defined above) and at least one metal compound of metallic element B (as defined above), said metal compounds being each independently in the form of either an alkoxymetal, a β-diketone metal complex or a metal acetate, with (b) at least one member of the group consisting of alcohols, carboxylic anhydrides, glycols, β-diketones and dicarboxylic acid monoesters.

DETAILED DESCRIPTION OF THE INVENTION

Unless otherwise noted, the expression reading "a saturated or unsaturated hydrocarbon group having 1–6 carbon atoms" refers to a group with 1–6 carbon atoms that comprises carbon and hydrogen atoms in the presence of single or unsaturated carbon-carbon bonds. The "hydrocarbon group" to be used in the invention is either an aromatic or an aliphatic hydrocarbon group but aliphatic hydrocarbon groups are preferred, with alkyl groups being particularly preferred.

The "alkyl group having 1–6 carbon atoms" may be either straight-chained or branched and is exemplified by methyl, ethyl, propyl, i-propyl, butyl, t-butyl, pentyl, neopentyl and hexyl groups.

The "alkoxyl group having 1–6 carbon atoms" may be either straight-chained or branched and is exemplified by methoxy, ethoxy, propoxy, i-propoxy, butoxy, t-butoxy and neopentoxy groups.

The coating solution to be used in the invention for forming Bi-based dielectric thin films contains Bi, metallic element A (which is at least one member of the group consisting of Ca, Ba, Sr, Pb and Bi) and metallic element B (which is at least one member of the group consisting of Ti, Nb and Ta) and in order to provide Bi, metallic element A and metallic element B components, the coating solution contains compounds prepared by reacting (a) at least one compound of each of said metals, as selected from among alkoxymetals, β-diketone metal complexes and metal acetates with (b) at least one compound selected from among alcohols, carboxylic anhydrides, glycols, β-diketones and dicarboxylic acid monoesters.

The coating solution of the present invention is preferably one that is to form Bi-based dielectric thin films represented by the general formula (I):

$$A_a Bi_x B_b O_y \qquad (I)$$

where A is at least one metallic element selected from among Ca, Ba, Sr, Pb and Bi; B is at least one metallic element selected from among Ti, Nb and Ta; $1 \leq x \leq 4$, $0.5 \leq a \leq 2$, $2 \leq b \leq 5$, and y=[3x+a(valency of metallic element A)+b (valency of metallic element B)]/2.

Referring first to component (a), the alkoxymetals are those of Bi, metallic element A and metallic element B, respectively. The alkoxymetals which are preferably used in the present invention, are represented by $A(OR)_m$, $B(OR)_n$, and $Bi(OR)_3$ (where m is the atomic valency of metallic element A; n is the atomic valency of metallic element B; and R's are each independently an alkyl group having 1–6 carbon atoms).

The alkoxymetals are formed from alcohols which are preferably represented by the general formula (II):

$$R^1 OH \qquad (II)$$

where $R^1$ is a saturated or unsaturated hydrocarbon group having 1–6 carbon atoms. Specific examples of such alcohols include methanol, ethanol, propanol, butanol, amyl alcohol and cyclohexanol. Metal alkoxides of these alcohols are preferably used in the invention.

Apart from these, alcohols in which hydrogen atoms in $R^1$ are substituted by alkoxyl groups of 1–6 carbon atoms may also be used and specific examples include methoxymethanol, methoxyethanol, ethoxymethanol and ethoxyethanol.

The β-diketone metal complexes are formed from β-diketones and at least one diketone is preferably used as selected from among those which include β-ketoesters represented by the general formula (III):

$$R^2COCR^3HCOR^4 \qquad (III)$$

where $R^2$ is a saturated or unsaturated hydrocarbon group having 1–6 carbon atoms; $R^3$ is H or $CH_3$; and $R^4$ is an alkyl or alkoxy group having 1–6 carbon atoms.

Specific examples of the β-diketones to be used in the invention include acetylacetone, 3-methyl-2,4-pentanedione and benzoylacetone. Exemplary β-ketoesters include ethyl acetoacetate and diethyl malonate. Other complex formers may of course be employed; however, dipivaloylmethane and THF adducts thereof, as well as complex formers such as hexafluoroacetylacetone that form metal halides after baking are not suitable for use in the production of the coating solution of the invention since they form highly sublimable or volatile metal complexes.

Referring now to component (b), at least one alcohol is preferably used as selected from among the alcohols represented by the general formula (II), where $R^1$ is the same as already defined above. Specific examples of applicable alcohols include methanol, ethanol, propanol, butanol, amyl alcohol and cyclohexanol.

Apart from these, alcohols in which hydrogen atoms in $R^1$ are substituted by alkoxyl groups 1–6 carbon atoms may also be used and specific examples include methoxymethanol, methoxyethanol, ethoxymetanol and ethoxyethanol.

Regarding carboxylic anhydrides as component (b), at least one compound is preferably used as selected from among the carboxylic anhydrides represented by the general formula (IV):

$$R^5(CO)_2O \qquad (IV)$$

where $R^5$ is a divalent saturated or unsaturated hydrocarbon group having 1–6 carbon atoms. Specific examples of the carboxylic anhydrides that can be used in the invention include maleic anhydride, citraconic anhydride, itaconic anhydride, succinic anhydride, methylsuccinic anhydride, glutaric anhydride, α-methylglutaric anhydride, α, α-dimethylglutaric anhydride and trimethylsuccinic anhydride.

At least one compound is preferably used as component (b) as selected from among the glycols represented by the general formula (V):

$$HOR^6OH \qquad (V)$$

where $R^6$ is a divalent saturated or unsaturated hydrocarbon group having 1–6 carbon atoms.

Specific examples of the glycols that can be used in the invention include ethylene glycol, diethylene glycol, propylene glycol, dipropylene glycol, butane diol, pentane diol, hexylene glycol and glycerin glycol. These glycols are especially effective when they are used in combination with β-diketones which are described just below as component (b) and the effect to be achieved is the enhanced stability of the liquid after optional hydrolysis.

At least one compound is preferably used as component (b) in the invention as selected from among the β-diketones including the β-ketoesters represented by the general formula (III). Specific examples of such β-diketones include acetylacetone, 3-methyl-2,4-pentanedione and benzoylacetone. Exemplary β-ketoesters include ethyl acetoacetate and diethyl malonate. Other complex formers may of course be employed; however, dipivaloylmethane and THF adducts thereof, as well as complex formers such as hexafluoroacetylacetone that form metal halides after baking are not suitable for use in the production of the coating solution of the invention since they form highly sublimable or volatile metal complexes.

At least one compound is preferably used as component (b) as selected from among the dicarboxylic acid monoesters represented by the general formula (VI):

$$R^7OCOR^8COOH \qquad (VI)$$

where $R^7$ is a saturated or unsaturated hydrocarbon group having 1–6 carbon atoms; $R^8$ is a divalent saturated or unsaturated hydrocarbon group having 1–6 carbon atoms.

Such dicarboxylic acid monoesters may be half esters prepared by reacting dibasic carboxylic acids with alcohols. Specific examples of dibasic carboxylic acids are oxalic acid, malonic acid, succinic acid, glutaric acid, adipic acid, pimelic acid, suberic acid, azelaic acid, sebacic acid, maleic acid, citraconic acid, itaconic acid, methylsuccinic acid, α-methylglutaric acid, α, α-dimethylglutaric acid and trimethylglutaric acid; at least one of these dibasic acids may be esterified with at least one alcohol as selected from among methyl alcohol, ethyl alcohol, propyl alcohol, butyl alcohol, amyl alcohol, hexyl alcohol, ethylene glycol monomethyl ether, propylene glycol monomethyl ether, etc. by known methods.

The above-mentioned examples of component (b) have preferably 1–6 carbon atoms in order to enhance the polarity of the metal compounds to be produced and the inorganic nature of the coating solution to be finally obtained.

The BLSF coating solution of the invention is synthesized by reacting the component (a) with the component (b). Needless to say, one reaction product between components (a) and (b) may be reacted with another reaction product between the two components and the product of this reaction can also be used preferably in the invention. Specific examples of the reaction between components (a) and (b) are given below but, needless to say, the invention is in no way limited to those examples:

(1) the reaction between an alkoxymetal and a dicarboxylic acid monoester;
(2) the reaction between an alkoxymetal and a dicarboxylic anhydride;
(3) the reaction between an alkoxymetal and a β-diketone;
(4) the reaction between the reaction product (3) and a glycol;
(5) the reaction between an alkoxymetal, a dicarboxylic acid monoester and a β-diketone;
(6) the reaction between an alkoxymetal, a carboxylic anhydride and a β-diketone;
(7) the reaction between one of the reaction products (1)–(6) and another;
(8) the reaction of an alcohol, a dicarboxylic anhydride, a glycol, β-diketone or a dicarboxylic acid monoester with the product of reaction between an alkoxymetal and a metal acetate (the metals may be the same or different);
(9) the reaction between the reaction product (8) and one of the reaction products (1)–(7);

(10) partial hydrolysis of one of the reaction products (7)–(9);

(11) the reaction of an alcohol, a dicarboxylic acid monoester, a carboxylic anhydride or a β-diketone and the product of reaction between an acidic alkoxymetal and a basic alkoxymetal;

(12) the reaction between the reaction product (11) and one of the reaction products (1)–(7); and (13) partial hydrolysis of the reaction product (12).

The reaction products (1)–(9), (11) and (12) are particularly suited to the production of MOD coating solutions whereas the reaction products (10) and (13) are suitable for coating solutions of a sol-gel type.

The coating solution of the invention is produced by dissolving one of those reaction products in organic solvents having oxygen atoms in the molecule. Examples of such solvents include alcohols, polyhydric alcohols, ethers, ketones, esters and lower carboxylic acids.

Exemplary alcoholic solvents include methanol, ethanol, propanol, butanol, amyl alcohol, cyclohexanol and methyl cyclohexanol.

Exemplary polyhydric alcohol based solvents include ethylene glycol monomethyl ether, ethylene glycol monoacetate, diethylene glycol monoethyl ether, diethylene glycol monoacetate, propylene glycol monoethyl ether, propylene glycol monoacetate, dipropylene glycol monoethyl ether and methoxybutanol.

Exemplary ether based solvents include methylal, diethyl ether, dipropyl ether, dibutyl ether, diamyl ether, diethyl acetal, dihexyl ether, trioxane and dioxane.

Exemplary ketone based solvents include acetone, methyl ethyl ketone, methyl propyl ketone, methyl isobutyl ketone, methyl amyl ketone, methyl cyclohexyl ketone, diethyl ketone, ethyl butyl ketone, trimethyl nonanone, acetonitrile acetone, dimethyl oxide, phorone, cyclohexanone and diacetone alcohol.

Exemplary ester based solvents include ethyl formate, methyl acetate, ethyl acetate, butyl acetate, cyclohexyl acetate, methyl propionate, ethyl butyrate, ethyl oxoisobutyrate, ethyl acetoacetate, ethyl lactate, methoxybutyl acetate, diethyl oxalate and diethyl malonate.

Exemplary lower carboxylic acid based solvents include acetic acid, propionic acid, butyric acid, and valeric acid.

The solvents listed above may be used either singly or in admixture.

The organometallic compounds of the invention are also highly soluble in aromatic hydrocarbon based solvents; however, as already mentioned, these solvents are not preferred since they are subject to increasingly rigorous regulations on the methods of their use and management.

The selection of the most preferred solvent depends on specific coating conditions such as those of open spin coating, closed spin coating, liquid source misted chemical vapor deposition (LSM-CVD) and dip coating.

In the production of the coating solution of the invention, component (a) may be hydrolyzed before it is reacted with component (b) or, alternatively, the product of reaction between components (a) and (b) may be hydrolyzed. In either way, the hydrolysis is preferred since the precipitation (segregation) of metal elements and the loss of the organic content of the coating solution due to burning can be further reduced. In addition, the inorganic nature of the applied coating can be enhanced by hydrolysis.

In order to perform the hydrolytic reaction, water alone or in combination with a catalyst may be added to the coating solution, which then is stirred at 20°–80° C. for several hours to several days. Any catalysts such as metal alkoxides that are known in the art of hydrolysis may be employed and exemplary catalysts include: acid catalysts such as inorganic acids (e.g. hydrochloric acid, sulfuric acid and nitric acid); and organic acids (e.g. acetic acid, propionic acid and butyric acid); and inorganic or organic alkali catalysts such as sodium hydroxide, potassium hydroxide, ammonia, monoethanolamine, diethanolamine and tetramethylammonium. Among these, acid catalysts are particularly preferred from various viewpoints such as the denseness of the coating to be finally obtained and its electrical characteristics.

Hydrolytic reaction may also be performed by exposing the surface of the as-applied coating on an electrode to a humidified atmosphere at a temperature of about 50°–120° C. for about 10–60 minutes at a humidity of about 50–100%.

The conditions of hydrolytic reaction are in no way limited to those set forth above and they may be selected as appropriate for the specific use of the coating.

The hydrolytic treatment is effective in not only reducing the organic content of the dried coating but also forming bonds of metal elements (metaloxane bonds) via oxygen; hence, the precipitation (segregation) of Bi and other metallic elements, as well as the loss of the organic content due to burning can be suppressed.

By thusly performing various treatments such as carboxylation, conversion to β-diketone forms and chelation, the synthesis of polar and highly stable organometallic compounds could successfully be accomplished with improved hydrolyzability and subsequent applicability to practical polar solvents. As a result, a polycondensation reaction could be allowed to proceed through the sol-gel method in the coating solution by a sufficient degree to enhance the inorganic nature of the coating solution which has the hydrolyzed metal compounds dissolved therein.

It should particularly be noted that the keeping quality of the coating solution could be improved by the reaction with carboxylic anhydrides or dicarboxylic acid monoester or by the reaction between β-diketone and glycol.

We now describe a method of producing a dielectric thin film and a dielectric memory using the coating solution of the invention.

Figure 1:
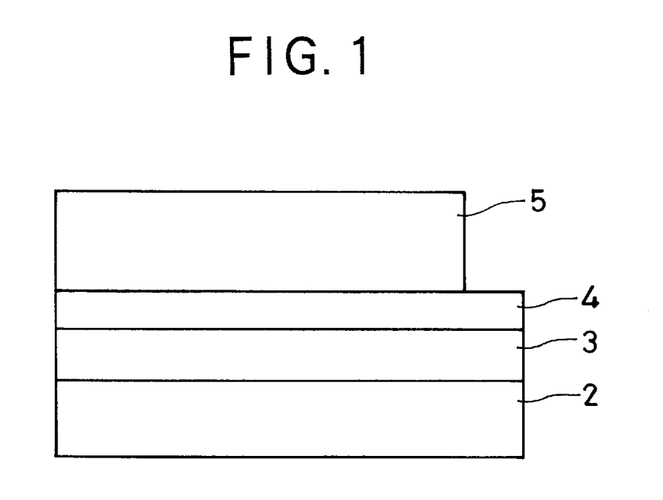
FIG. 1 shows schematically a structure of the dielectric thin film of the invention.

As shown in FIG. 1, a substrate 2 such as a Si wafer is first oxidized to form a Si oxide layer 3 which is overlaid with a lower electrode 4 that is formed from a metal such as Pt, Ir, Ru, Re or Os or a conductive metal oxide thereof by a known technique such as sputtering or vapor deposition. The lower electrode 4 is then coated with the coating solution of the invention by a known technique such as spin coating or dipcoating and the applied coating is dried at a temperature of 50°–200° C., followed by prebaking at a temperature of 200°–700° C. Preferably, the process from the application of the coating solution to the prebaking of the dried coating is repeated several times until a desired film thickness is attained. Subsequently, baking is performed at an elevated temperature of 700°–900° C. in an oxygen atmosphere to form a crystalline dielectric thin film 5. The baking step may be performed by any suitable method such as a furnace process in which the temperature is raised from room temperature to the baking temperature at a rate of about 5°–20° C./min, followed by baking at that temperature for about 30–80 minutes, or a rapid thermal processing (RTP) method in which the temperature is raised from room temperature to the baking temperature at a rate of about 50°–150° C./sec, followed by baking at that temperature for about 0.5–3 minutes.

Figure 2:
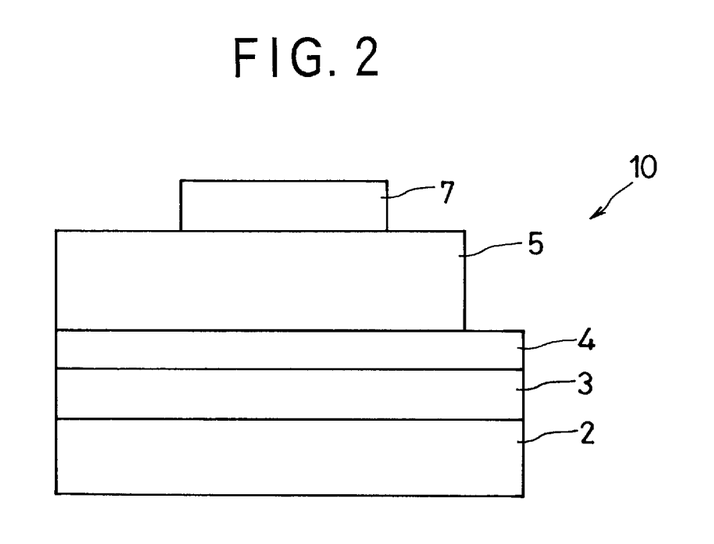
FIG. 2 shows schematically a structure of the dielectric memory of the invention.

Then, as shown in FIG. 2, the thus prepared dielectric thin film 5 is overlaid with a top electrode 7, which may be formed of the metals or conductive metal oxides that have been listed in connection with the formation of the lower electrode 4; these materials are deposited on the dielectric thin film 5 by any known technique such as sputtering or vapor deposition and baked at a high temperature of 700°–900° C. in an oxygen atmosphere to fabricate a dielectric memory which is generally indicated by 10 in FIG. 2. The top electrode 7 may be formed of a different material than the lower electrode 4; for instance, Ir is used to make the lower electrode 4 whereas Ru is used to make the top electrode 7.

If a hydrolytic reaction is to be performed in a humidified atmosphere, the as-applied coating may be heated at a humidity of 50–100%, preferably 70–100%, for 10–60 minutes at a temperature of 50°–120° C. before prebaking.

By performing a hydrolytic treatment within the coating solution, the precipitation (segregation) of metal elements such as Bi and the loss of the organic content due to burning which occur during the application of the coating solution or the baking step can be reduced to very low levels.

Even if the coating solution is not rendered fully inorganic by the sol-gel method (hydrolytic treatment) or even in the case of a MOD coating solution which is not subjected to hydrolytic treatments at all, the as-applied coating on the substrate may be exposed to a humidified atmosphere for a certain period preceding the prebaking step as described above and by so doing, hydrolytic polycondensation will proceed to render the coating sufficiently inorganic to form a dense film.

An excessive hydrolytic treatment in the coating solution may potentially increase the viscosity of the coating solution gel or change its properties with time. The above-mentioned hydrolytic treatment of the as-applied coating prior to prebaking is effective in order to avoid these possibilities.

It should be noted here that if a MOD coating solution made of a metal salt of a carboxylic acid having a long-chain organic group as described in connection with the prior art is applied onto a substrate and if the as-applied coating is subjected to a hydrolytic treatment prior to prebaking, the progress of the reaction is either inhomogeneous or negligible and there is a limit on the denseness of the coating to be finally formed.

It should also be noted that the values of subscripts x, a and b in the general formula (I) of the Bi-based dielectric thin film which represent the contents of Bi, metallic elements A and B, respectively, in the coating solution of the invention are variable with the site and conditions of the application of the coating solution. Hence, appropriate formulations can be selected depending upon various conditions such as the type of the device to which the invention is to be applied (e.g. FRAM, DRAM, MFS, MFIS or MFMIS), the type of top and lower electrodes to be used, their thicknesses, combinations of the two electrodes, the type of barrier layer, its thickness, and the presence or absence of a seed layer (orientation layer).

The contents of individual organometallic compounds, the type and amount of residual alkoxy group, the proportion of the carbonyl group to be incorporated, the degree of chelation (complex formation), the degree of hydrolysis, the degree of polycondensation and the degree of complex alkoxylation can be selected in many ways depending upon various factors such as the use of the coating solution of the invention and the conditions under which it is to be employed (e.g. the temperature, time, atmosphere and the method of temperature elevation which are to be adopted in the drying and baking steps). Therefore, the following examples of the invention are intended to describe just a few embodiments among the many fields of application of the invention and should in no way be taken as limiting.

EXAMPLES

Synthesis of Sr Compound 1

| (a) Ethanol | 80.00 g |
|---|---|
| (b) 3-Methoxybutanol | 47.54 g |
| (c) Ethyl acetoacetate (hereunder abbreviated as "H β") | 29.70 g |
| (d) Metallic Sr | 10.00 g |

Ingredients (a)–(c) were mixed and heated at 60°–70° C. To the heated mixture, pieces of (d) were added in small portions as the reaction was allowed to proceed. Finally, the temperature of the reaction mixture was raised to about 77° C., then lowered to room temperature (25° C.), whereby the reaction was brought to an end. Ethanol was added in a sufficient amount to compensate for the evaporation loss, thereby yielding a solution of Sr compound 1, or a β-ketoester complex of Sr, in an amount of 150.64 g.

Synthesis of Bi Compound 1

| (a) A solution of 21.41 wt % $Bi(n-C_4H_9O)_3$ in methoxypropanol | 500.00 g |
|---|---|
| (b) Maleic anhydride | 73.55 g |

Ingredient (b) was added to (a) at room temperature and the mixture was stirred. The temperature of the liquid was raised by about 9° C. and when a complete solution formed, the temperature was raised to 100° C. With this temperature maintained, reaction was performed for 2 hours, thereby yielding a solution of dark red Bi compound 1 in an amount of 564.02 g.

Synthesis of Ta Compound 1

| (a) Ethanol | 9.21 g |
|---|---|
| (b) $Ta(OC_2H_5)_5$ | 16.25 g |
| (c) Maleic anhydride | 19.61 g |

Ingredient (b) was added to (a); then (c) was added and the mixture was heated to 77° C. With this temperature maintained, stirring was continued for 2 hours, then followed by cooling to room temperature (25° C.) to end the reaction. Ethanol was added in a sufficient amount to compensate for the evaporation loss, thereby yielding a solution of Ta compound 1 in an amount of 44.71 g.

Preparation of Coating Solution 1 for Use in Forming Bi-Based Dielectric Thin Film

| (a) Solution of Sr compound 1 | 18.50 g |
|---|---|
| (b) Solution of Bi compound 1 | 103.78 g |
| (c) Solution of Ta compound 1 | 44.71 g |

Ingredients (a)–(c) were mixed and stirred at room temperature (25° C.) for 2 hours to prepare 166.99 g of coating solution 1 containing Sr, Bi and Ta at molar ratios of 0.7:2.3:2.0.

Synthesis of Bi Compound 2

| | | |
|---|---|---|
| (a) Solution of 21.41 wt % Bi(n-C$_4$H$_9$O)$_3$ in toluene | 500.00 g | |
| (b) H β | 97.61 g | |

Ingredients (a) and (b) were mixed under stirring to perform reaction at 85° C. for 5 hours. In order to compensate for the toluene that distilled off during the reaction, butanol was added accordingly, thereby ensuring that the weight of the solution was held between 500 and 550 g. Finally, butanol was added to yield a solution of Bi compound 2 in an amount of 596.37 g.

Synthesis of Ta Compound 2

| | |
|---|---|
| (a) Ethanol | 9.21 g |
| (b) Ta(OC$_2$H$_5$)$_5$ | 16.25 g |
| (c) H β | 26.03 g |

Ingredients (a)–(c) were mixed and heated to 75° C. With this temperature maintained, stirring was continued for 5 hours, then followed by cooling to room temperature (25° C.) to end the reaction. Ethanol was added in a sufficient amount to compensate for the evaporation loss, thereby yielding a solution of Ta compound 2 in an amount of 51.49 g.

Preparation of Coating Solution 2 for Use in Forming Bi-Based Dielectric Thin Film

| | |
|---|---|
| (a) Solution of Sr compound 1 | 37.00 g |
| (b) Solution of Bi compound 2 | 197.51 g |
| (c) Solution of Ta compound 2 | 92.68 g |
| (d) Ethylene glycol monomethyl ether (hereunder abbreviated as "MC") | 535.39 g |

Ingredients (a)–(d) were mixed and stirred at room temperature for 2 hours to yield 862.58 g of coating solution 2 containing Sr, Bi and Ta at molar ratios of 0.7:2.3:2.0.

Synthesis of Sr Compound 2

| | |
|---|---|
| (a) Ethanol | 50.00 g |
| (b) 3-Methoxy-1-butanol | 47.54 g |
| (c) H β | 29.70 g |
| (d) Sr(OCH$_3$)$_2$ | 17.02 g |

Ingredients (a)–(d) were mixed and refluxed at 80° C. for 2 hours, yielding a solution of Sr compound 2 in an amount of 144.26 g.

Synthesis of Sr.Ta Compound 1

| | |
|---|---|
| (a) Solution of Sr compound 2 | 50.59 g |
| (b) Ta(OC$_2$H$_5$)$_5$ | 32.50 g |

Ingredients (a) and (b) were mixed and refluxed at 80° C. for 2 hours, yielding a solution of Sr.Ta compound 1 in an amount of 83.09 g.

Synthesis of Sr.Ta Compound 2

| | |
|---|---|
| (a) Solution of Sr.Ta compound 1 | 83.09 g |
| (b) Maleic anhydride | 23.53 g |

Ingredients (a) and (b) were mixed and refluxed at 80° C. for 2 hours, yielding a solution of Sr.Ta compound 2 in an amount of 106.61 g.

Synthesis of Bi Compound 3

| | |
|---|---|
| (a) Solution of 21.47 wt % Bi(n-C$_4$H$_9$O)$_3$ in propylene glycol monomethyl ether | 160.00 g |
| (b) Maleic anhydride | 23.53 g |
| (c) Ethanol | 72.00 g |

Ingredients (b) and (c) were mixed to form a solution, which was refluxed at 80° C. for 3 hours, to give a solution of monoethyl maleate. The residual ethanol was removed with a rotary evaporator. Following the addition of (a), the solution was refluxed at 100° C. for 4 hours to yield a solution of Bi compound 3 in an amount of 183.53 g.

Preparation of Coating Solution 3 for Use in Forming Bi-Based Dielectric Thin Film

| | |
|---|---|
| (a) Solution of Sr.Ta compound 2 | 106.61 g |
| (b) Solution of Bi compound 3 | 183.53 g |
| (c) Propylene glycol monomethyl ether (hereunder abbreviated as "PGME") | 215.58 g |

Ingredients (a)–(c) were mixed and stirred at 50° C. for 2 hours to yield 505.72 g of coating solution 3 containing Sr, Bi and Ta at molar ratios of 1:2:2.

Synthesis of Sr.Ta Compound 3

| | |
|---|---|
| (a) Solution of Sr.Ta compound 2 | 83.08 g |
| (b) H β | 31.23 g |

Ingredients (a) and (b) were mixed and refluxed at 80° C. for 2 hours to yield a solution of Sr.Ta compound 3 in an amount of 114.31 g.

Synthesis of Bi Compound 4

| | |
|---|---|
| (a) Solution of 21.47 wt % Bi(n-C$_4$H$_9$O)$_3$ in PGME | 160.00 g |
| (b) H β | 31.23 g |

Ingredients (a) and (b) were mixed and refluxed at 80° C. for 5 hours to yield a solution of Bi compound 4 in an amount of 191.23 g.

Preparation of Coating Solution 4 for Use in Forming Bi-Based Dielectric Thin Film

| | |
|---|---|
| (a) Solution of Sr.Ta compound 3 | 114.31 g |
| (b) Solution of Bi compound 4 | 191.23 g |
| (c) PGME | 144.00 g |

Ingredients (a)–(c) were mixed and heated under stirring at 50° C. for 2 hours to yield a solution (449.54 g); 100.00 g of the solution was mixed with 80.00 g of PGME and the mixture was stirred at room temperature (25° C.) for 2 hours to yield 180.00 g of coating solution 4 containing Sr, Bi and Ta at molar ratios of 1:2:2.

Synthesis of Sr.Ta Compound 4

| | |
|---|---|
| (a) MC | 300.08 g |
| (b) Ta(OC$_2$H$_5$)$_5$ | 91.45 g |
| (c) Sr(OC$_2$H$_5$)$_2$ | 20.00 g |

Ingredients (a)–(c) were mixed and refluxed at 85° C. for 6 hours, yielding a solution of Sr.Ta compound 4 in an amount of 411.45 g.

Preparation of Coating Solution 5 for Use in Forming Bi-Based Dielectric Thin Film

| | |
|---|---|
| (a) Solution of Sr.Ta compound 4 | 411.45 g |
| (b) Solution of 21.47 wt % Bi(n-C$_4$H$_9$O)$_3$ in PGME | 449.10 g |

Ingredients (a) and (b) were mixed and heated under stirring at 70° C. for 2 hours to yield a solution (860.55 g); 860.54 g of the solution was mixed with 176.60 g of itaconic anhydride and the mixture was refluxed at 80° C. for 2 hours; 100.00 g of the mixture was then mixed with 21.96 g of PGME and stirred at room temperature (25° C.) for 2 hours to yield 121.96 g of coating solution 5 containing Sr, Bi and Ta at molar ratios of 1:2:2.

Synthesis of Pb Compound 1

| | |
|---|---|
| (a) Pb(OCOCH$_3$)$_2$.3H$_2$O | 20.68 g |
| (b) PGME | 100.00 g |

Ingredient (a) was dissolved in (b) and the solution was dehydrated azeotropically under stirring at 110°–140° C. Following addition of PGME (60.00 g), the mixture was further stirred. Then, the temperature of the solution was lowered to 80° C., yielding a white turbid solution of Pb compound 1 in an amount of 180.68 g.

Synthesis of Pb.Nb Compound 1

| | |
|---|---|
| (a) Solution of Pb compound 1 | 180.68 g |
| (b) Nb(OC$_2$H$_5$)$_5$ | 34.70 g |

With ingredient (a) held at 80° C., (b) was added and the mixture was immediately heated to 110°–115° C. for performing azeotropic deesterification. During the reaction, PGME was added and adjusted the overall weight of the reaction solution to about 120 g. Following 30 hours' refluxing, the reaction solution was diluted with PGME to yield a solution of Pb.Nb compound 1 in an amount of 135.38 g.

Preparation of Coating Solution 6 for Use in Forming Bi-Based Dielectric Thin Film

| | |
|---|---|
| (a) Solution of Pb.Nb compound 1 | 135.38 g |
| (b) Solution of 21.47 wt % Bi(n-C$_4$H$_9$O)$_3$ in PGME | 200.00 g |

Ingredients (a) and (b) were mixed and stirred at 80° C. for 2 hours; after cooling to room temperature, the reaction mixture was diluted with PGME (18.11 g) to yield a solution (350.00 g). Maleic anhydride (42.78 g) was added to the solution at room temperature (25° C.); when a uniform solution on formed, its temperature was raised to 80° C. and with this temperature maintained, stirring was continued for 3 hours. After the end of the reaction, the reaction system was cooled to room temperature (25° C.) to yield solution (392.78 g).

A portion (100.00 g) of the solution was diluted with 120.99 g of PGME to yield 220.99 g of coating solution 6 containing Pb, Bi and Nb at molar ratios of 1:2:2.

Synthesis of Pb Compound 2

| | |
|---|---|
| (a) Pb(OCOCH$_3$)$_2$.3H$_2$O | 18.97 g |
| (b) PGME | 100.00 g |

Ingredient (a) was dissolved in part of (b) and the solution was dehydrated azeotropically under stirring at 100° C. Then, PGME (50.00 g) was added and the mixture was further stirred. Subsequently, the temperature of the solution was lowered to 80° C., yielding a white turbid solution of Pb compound 2 in an amount of 170.00 g.

Synthesis of Pb.Ti Compound 1

| | |
|---|---|
| (a) Solution of Pb compound 2 | 170.00 g |
| (b) Ti(i-C$_3$H$_7$O)$_4$ | 35.53 g |

With ingredient (a) held at 80° C., (b) was added and the mixture was immediately heated to 110°–114° C. for performing azeotropic deesterification. During the reaction, PGME was added and adjusted the overall weight of the reaction solution to about 170.00 g. After 30 hours' refluxing, a small amount of PGME was distillated off to yield a solution of Pb.Ti compound 1 in an amount of 135.53 g.

Preparation of Coating Solution 7 for Use in Forming Bi-Based Dielectric Thin Film

| | |
|---|---|
| (a) Solution of Pb.Ti compound 1 | 135.53 g |
| (b) Solution of 21.47 wt % Bi(n-C$_4$H$_9$O)$_3$ in PGME | 199.51 g |

Ingredients (a) and (b) were mixed and stirred at 80° C. for 2 hours; after cooling to room temperature, the mixture was diluted with PGME to yield a solution (300.00 g).

To the solution, there was added H β(35.79 g) in small portions at room temperature (25° C.); the mixture was heated to 80° C. and with this temperature maintained, stirring was continued for 2 hours. After the end of the reaction, the mixture was cooled to room temperature (25° C.) to yield a solution (335.79 g).

A portion (100.00 g) of the solution was diluted with PGME (120.60 g) at room temperature and stirred for another 2 hours to yield 220.60 g of coating solution 7 containing Pb, Bi and Ti at molar ratios of 2:4:5.

Synthesis of Ba.Ti Compound 1

| | | |
|---|---|---|
| (a) | $Ti(i-OC_3H_7)_4$ | 28.43 g |
| (b) | $Ba(OC_2H_5)_2$ | 5.69 g |
| (c) | MC | 100.00 g |

Ingredients (a)–(c) were mixed to form a suspension at room temperature (25° C.); the suspension was heated to 80° C. and with this temperature maintained, the suspension was stirred for 2 hours to form a uniform solution. After cooling to room temperature (25° C.), MC was added to yield a solution Ba.Ti compound 1 in an amount of 120.00 g.

Synthesis of Ba.Ti Compound 2

| | | |
|---|---|---|
| (a) | Solution of Ba.Ti compound 1 | 120.00 g |
| (b) | H β | 9.76 g |

To ingredient (a), (b) was added in small portions under stirring at room temperature (25° C.); then, the mixture was heated to 80° C. and with this temperature maintained, stirring was continued for 2 more hours; after cooling to room temperature (25° C.), the mixture was diluted with MC to yield a solution of Ba.Ti compound 2 in an amount of 139.52 g.

Synthesis of Ba.Ti Compound 3

| | | |
|---|---|---|
| (a) | Solution of Ba.Ti compound 2 | 139.52 g |
| (b) | Propylene glycol (PG) | 5.71 g |
| (c) | Acetic acid (hereunder abbreviated as "HOAc") | 27.04 g |

To ingredient (a), (b) was added in small portions under stirring at room temperature (25° C.); following stirring at 60° C. for 3 hours, the mixture was cooled to room temperature; (c) was added to the cooled mixture in small portions under stirring; continued stirring for another hour gave a solution of Ba.Ti compound 3 in an amount of 172.27 g.

Synthesis of Bi Compound 5

| | | |
|---|---|---|
| (a) | Solution of 21.47 wt % $Bi(n-C_4H_9O)_3$ in PGME | 199.51 g |
| (b) | H β | 19.52 g |

To ingredient (a), (b) was added in small portions at room temperature (25° C.) and the mixture was heated to 80° C.; with this temperature maintained, the mixture was stirred for 2 hours. After the end of the reaction, the mixture was cooled to room temperature (25° C.) and diluted with MC to yield a solution of Bi compound 5 in an amount of 220.00 g.

Synthesis of Bi Compound 6

| | | |
|---|---|---|
| (a) | Solution of Bi compound 5 | 220.00 g |
| (b) | PG | 11.41 g |
| (c) | HOAc | 18.02 g |

To ingredient (a), (b) was added in small portions and the mixture was heated to 60° C.; with this temperature maintained, the mixture was stirred for 3 hours. After the end of the reaction, the mixture was cooled to room temperature (25° C.). Thereafter, ingredient (c) was added under stirring; by stirring for an additional hour, a solution of Bi compound 6 was obtained in an amount of 249.43 g.

Preparation of Coating Solution 8 for Use in Forming Bi-Based Dielectric Thin Film

| | | |
|---|---|---|
| (a) | Solution of Ba.Ti compound 3 | 172.26 g |
| (b) | Solution of Bi compound 6 | 249.43 g |

Ingredient (a) and (b) were mixed and stirred for 3 hours; the mixture was aged at room temperature (25° C.) for 7 days to prepare a reaction solution (421.69 g).

A portion (100.00 g) of the solution was mixed with MC (19.00 g) and the mixture was stirred at room temperature for 3 hours to yield 119.00 g of coating solution 8 containing Ba, Bi and Ti at molar ratios of 1:4:4.

Preparation of Coating Solution 9 for Use in Forming Bi-Based Dielectric Thin Film

| | | |
|---|---|---|
| (a) | Solution of coating solution 3 | 202.29 g |
| (b) | Water | 1.15 g |
| (c) | PGME | 66.27 g |

A premix of ingredients (b) and (c) was added in small portions into (a) under stirring. The mixture was stirred for an additional 2 hours at room temperature (25° C.) to perform a hydrolytic reaction, thereby yielding 269.71 g of coating solution 9 of a sol-gel type containing Sr, Bi and Ta at molar ratios of 1:2:2.

Preparation of Coating Solution 10 for Use in Forming Bi-Based Dielectric Thin Film

| | | |
|---|---|---|
| (a) | Solution of coating solution 5 | 184.30 g |
| (b) | Water | 1.44 g |
| (c) | PGME | 151.41 g |

Ingredients (a)–(c) were reacted in the same manner as in the preparation of coating solution 9, whereby coating solution 10 of a sol-gel type containing Sr, Bi and Ta at molar ratios of 1:2:2 was yielded in amount of 337.15 g.

Preparation of Coating Solution 11 for Use in Forming Bi-Based Dielectric Thin Film

| | |
|---|---|
| (a) Product of reaction between Pb.Nb compound 1 and solution of 21.47 wt % Bi(n-$C_4H_9O$)$_3$ in PGME | 144.06 g |
| (b) Water | 0.73 g |
| (c) PGME | 173.58 g |

Ingredients (a)–(c) were reacted in the same manner as in the preparation of coating solution 9, whereby coating solution 11 of a sol-gel type containing Pb, Bi and Nb at molar ratios of 1:2:2 was yielded in an amount of 318.37 g.

Preparation of Coating Solution 12 for Use in Forming Bi-Based Dielectric Thin Film

| | |
|---|---|
| (a) Product of reaction between Ba.Ti compound 3 and Bi compound 6 | 100.00 g |
| (b) Water | 0.32 g |
| (c) PGME | 38.49 g |

Ingredients (a)–(c) were reacted in the same manner as in the preparation of coating solution 9, whereby coating solution 12 of a sol-gel type containing Ba, Bi and Ti at molar ratios of 1:4:4 was yielded in an amount of 138.81 g.

Synthesis of Sr Compound 3

| | |
|---|---|
| (a) MC | 103.00 g |
| (b) Metallic Sr | 14.50 g |

Ingredient (b) was added in small portions to (a) as it was held at 40° C. and the entire portion of (b) was introduced in a temperature range of 40°–60° C. Thereafter, the mixture was heated at 80° C. for 2 hours to yield a solution of Sr compound 3 in an amount of 107.00 g.

Synthesis of Sr.Bi.Ta Compound 1

| | |
|---|---|
| (a) MC | 103.00 g |
| (b) Ta (OC$_2$H$_5$)$_5$ | 55.00 g |
| (c) Solution of 21.47 wt % Bi(n-$C_4H_9O$)$_3$ in toluene | 311.38 g |
| (d) Solution of Sr compound 3 | 36.22 g |

Ingredients (b), (c) and (d) were sequentially added to (a) and mixed under stirring at room temperature (25° C.). After 1 hour, heating of the mixture started and when a temperature of 90° C. was reached, the mixture was refluxed for 10 hours. Thereafter, the temperature of the solution was lowered and toluene was distilled off at 34° C. and 32 Torr to yield a solution (202.69 g).

Then, 269.09 g of MC was added, yielding a solution of Sr.Bi.Ta compound 1 in a amount of 472.48 g.

Synthesis of Sr.Bi.Ta Compound 2

| | |
|---|---|
| (a) Solution of Sr.Bi.Ta compound 1 | 471.02 g |
| (b) H β | 26.29 g |

Ingredient (b) was dripped in small portions into (a) at room temperature (25° C.) and the two ingredients were mixed under stirring. After 30 minutes, the temperature of mixture was raised to 80° C. and a thermal reaction was performed for 3 hours to yield a solution of Sr.Bi.Ta compound 2 in an amount of 495.65 g.

Synthesis of Sr.Bi.Ta Compound 3

| | |
|---|---|
| (a) Solution of Sr.Bi.Ta compound 2 | 495.65 g |
| (b) MC | 87.13 g |
| (c) PG | 5.12 g |

Ingredients (b) and (c) were mixed under stirring and the resulting premix was dripped in small portions into (a) under stirring to yield a solution of Sr.Bi.Ta compound 3 in an amount of 587.90 g.

Preparation of Coating Solution 13 for Use in Forming Bi-Based Dielectric Thin Film

| | |
|---|---|
| (a) Solution of Sr.Bi.Ta compound 3 | 34.93 g |
| (b) MC | 48.61 g |
| (c) H$_2$O | 0.29 g |

Ingredients (b) and (c) were mixed under stirring and the resulting premix was dripped into (a) in small portions such as to perform a hydrolytic reaction, whereby coating solution 13 of sol-gel type containing Sr, Bi and Ta at molar ratios of 0.7:2.3:2.0 was yielded in an amount of 83.83 g.

Using the thus prepared coating solutions for use in forming Bi-based dielectric thin films, various samples of dielectric thin film and memory were fabricated. The coating solutions were evaluated for keeping quality whereas the dielectric thin films were measured for thickness and quality. The thin films were also subjected to X-ray diffraction (XRD). The results are shown in Table 1. The dielectric memories were evaluated for hysteresis characteristics (remanent polarization, Pr). The respective evaluations and measurements were conducted by the following methods.

I. Coating Solutions

Keeping Quality

The coating solutions for forming Bi-based dielectric thin films were stored in polyethylene containers in air at 25° C. for 30 days. The results were evaluated by the following criteria: X, the container did not deform but the contents became increasingly viscous and gave rise to foreign matter; ○, the container deformed probably because the internal pressure decreased due to the evaporation of solvent from within the contents; ◎, the viscosity of the contents did not increase, nor did they give rise to foreign matter and the exterior of the container did not change at all.

II. Dielectric Thin Films

Thickness

A thermally oxidized SiO$_2$ layer was formed in a thickness of 100 nm on a 6 inch Si wafer and a lower Pt electrode was formed in a thickness of 60 nm on the SiO$_2$ layer by sputtering.

The coating solution was applied onto the Pt electrode by spin coating at 500 rpm for 1 second, then at 2000 rpm for 20 seconds; the applied coating was dried at 150° C. for 30 minutes, prebaked at 600° C. for 30 minutes and baked at 800° C. for 30 minutes to form a dielectric film. The thickness of the thus formed film was measured.

Additional thin films were formed by increasing the rotational speed of spin coating from 2000 rpm to 4000 and 6000 rpm; the thicknesses of these films were also measured.

Quality

The films formed by spin coating at 2000 rpm were examined for surface morphology and cross section with a surface scanning electron microscope (SEM). The results were evaluated by the following criteria; X, the film was rough-surfaced and porous; ○, the film was somewhat roughing-surfaced and porous; ◉, the film was smooth-surfaced and dense.

X-ray Diffraction (XRD)

A thermally oxidized $SiO_2$ layer was formed in a thickness of 100 nm on a 6-inch Si wafer and a lower Pt electrode was formed in a thickness of 60 nm the $SiO_2$ layer by sputtering.

Each coating solution was applied onto the Pt electrode by spin coating at 500 rpm for 1 second (step 1), then at 4000 rpm for 20 seconds (step 2), and the applied coating was dried at 150° C. for 30 minutes (step 3) and prebaked at 600° C. for 30 minutes (step 4). After repeating step (1)–(4) seven times, the coating was baked at 800° C. for 60 minutes in an oxygen atmosphere to form a dielectric thin film.

The film was subjected to X-ray diffraction for checking the strength of a (105) face plane.

III. Dielectric Memories

A thermally oxidized $SiO_2$ layer was formed in a thickness of 100 nm on a 6-inch Si wafer and a lower Pt electrode was formed in a thickness of 60 nm on the $SiO_2$ layer by sputtering.

Each coating solution was applied onto the Pt electrode by spin coating at 500 rpm for 1 second (step 1), at 4000 rpm for 20 seconds (step 2), and the applied coating was dried at 150° C. for 30 minutes (step 3) and prebaked at 600° C. for 30 minutes (step 4). After repeating step (1)–(4) seven times, the coating was baked at 800° C. for 30 minutes in an oxygen atmosphere to form a dielectric thin film.

A top Pt electrode (0.2 mm in diameter and 300 nm in thickness) was formed on the dielectric thin film by sputtering through a metal mask, thereby fabricating a dielectric memory.

A voltage was applied between the lower and top electrodes and the hysteresis characteristics of each memory were evaluated by measuring remanent polarization (Pr) at an applied voltage of 6 V.

Examples 1–13

Figure 3:
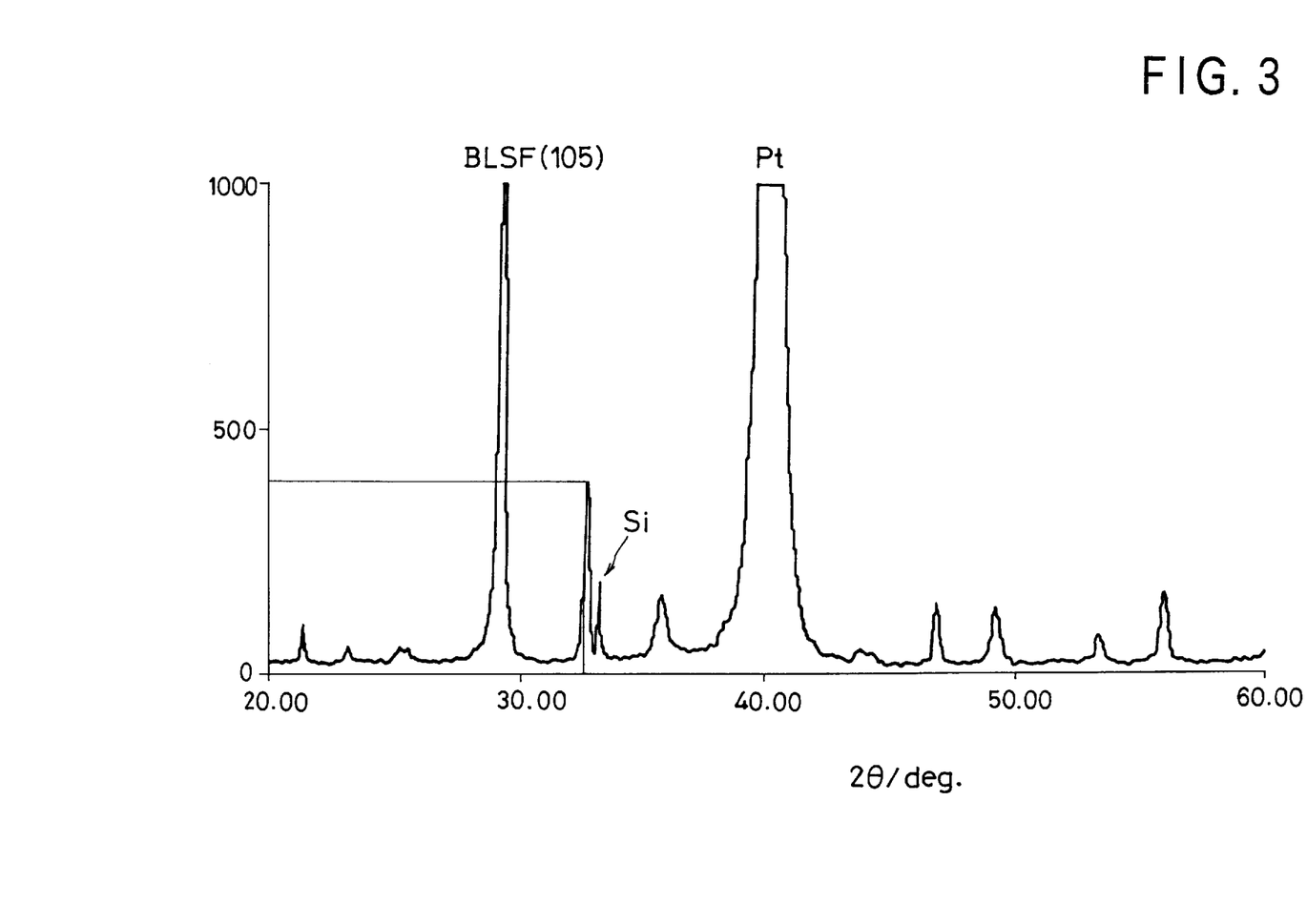
FIG. 3 is an X-ray diffraction scan of the dielectric memory fabricated in Example 1.

Coating solutions 1–13, as well as the dielectric thin films and memories fabricated using those coating solutions were evaluated by the methods described above. The results are shown in Table 1. The X-ray diffraction demonstrated that all dielectric films were Bi layer-structured films having a maximal strength at the (105) face plane with satisfactory hysteresis characteristics. The X-ray diffraction scan of the dielectric film prepared in Example 1 is shown in FIG. 3.

Comparative Example 1

A 5.00 wt % coating solution in MC was prepared; it contained $Sr(OC_2H_5)_2$, $Ta(OC_2H_5)_5$ and $Bi(OC_3H_7)_3$ at molar ratios of 1:2:2 was prepared. A dielectric film and memory were fabricated using this coating solution. The coating solution, the dielectric film and memory were evaluated as in the Examples and the results are also shown in Table 1.

Comparative Example 2

A 5.00 wt % coating solution in xylene was prepared; it contained the following metal salts of a monobasic long-chain carboxylic acid at molar ratios of 1:2:2, $Sr\{OCO(C_2H_5)C_5H_{10}\}_2$, $Ta\{OCO(C_2H_5)C_5H_{10}\}_5$ and $Bi\{OCO(C_2H_5)C_5H_{10}\}_3$. A dielectric film and memory were fabricated using this coating solution. The coating solution, the dielectric film and memory were evaluated as in the Examples and the results are also shown in Table 1.

TABLE 1

| | Coating solution | Film thickness, nm | | | Film quality | | | Remanent polarization |
| | | 2000 rpm | 4000 rpm | 6000 rpm | Keeping quality | Surface | Cross Section | (Pr), $\mu C/cm^2$ |
| --- | --- | --- | --- | --- | --- | --- | --- | --- |
| Example 1 | 1 | 41 | 31 | 21 | ◉ | ○ | ○ | 6.5 |
| Example 2 | 2 | 38 | 30 | 25 | ◉ | ○ | ○ | 4.8 |
| Example 3 | 3 | 107 | 93 | 75 | ◉ | ○ | ○ | 5.3 |
| Example 4 | 4 | 38 | 30 | 25 | ◉ | ○ | ○ | 4.7 |
| Example 5 | 5 | 115 | 91 | 58 | ◉ | ○ | ○ | 6.3 |
| Example 6 | 6 | 60 | 54 | 50 | ◉ | ○ | ○ | 5.8 |
| Example 7 | 7 | 63 | 56 | 52 | ◉ | ○ | ○ | 4.6 |
| Example 8 | 8 | 72 | 61 | 57 | ◉ | ○ | ○ | 5.9 |
| Example 9 | 9 | 40 | 31 | 24 | ◉ | ◉ | ◉ | 6.2 |
| Example 10 | 10 | 42 | 33 | 25 | ◉ | ◉ | ◉ | 4.9 |
| Example 11 | 11 | 45 | 38 | 34 | ◉ | ◉ | ◉ | 4.6 |
| Example 12 | 12 | 43 | 35 | 30 | ◉ | ◉ | ◉ | 5.3 |
| Example 13 | 13 | 28 | 21 | 18 | ◉ | ◉ | ◉ | 6.6 |
| Comparative example 1 | MC | 35 | 28 | 26 | X | ◉ | ◉ | 6.5 |
| Comparative example 2 | xylene | 85 | 78 | 75 | ○ | X | X | 4.8 |

Example 14

A thin film was formed as in Example 1, except that prior to the step of drying at 150° C. for 30 minutes, the substrate was placed in a thermostatic chamber (80° C.×90% RH) for 1 hour so that the as-applied coating was hydrolyzed on the substrate.

Examination under an electron microscope showed that the thin film formed in Example 14 was denser than the film of Example 1 not only on the surface but also in the bulk.

As described above in detail, the present invention provides coating solutions that cause only a very small amount of organic matter to be burnt away during film formation, that are soluble in practical organic solvents and that have good keeping quality. In addition, by using the coating solutions, dielectric thin films that are improved in film density and surface morphology can be formed at lower cost.

What is claimed is:

1. A coating solution for use in forming Bi-based dielectric thin films said films containing Bi, metallic element A which is at least one member selected from the group consisting of Ca, Ba, Sr, Pb and Bi, and metallic element B which is at least one member selected from the group consisting of Ti, Nb and Ta, said solution containing the reaction product of
   (a) at least one metal compound of Bi, at least one metal compound of metallic element A and at least one metal compound of metallic element B, said metal compounds being each independently in the form of either an alkoxymetal, a β-diketone metal complex or a metal acetate, with
   (b) at least one member selected from the group consisting of an alcohol, a carboxylic anhydride, a glycol, a β-diketone and a dicarboxylic acid monoester.

2. A coating solution according to claim 1, wherein said Bi-based dielectric thin films are represented by the general formula (I):

$$A_a Bi_x B_b O_y \qquad (I)$$

where A is at least one metallic element selected from among Ca, Ba, Sr, Pb and Bi, B is at least one metallic element selected from among Ti, Nb and Ta; $1 \leq x \leq 4$, $0.5 \leq a \leq 2$, $2b \leq 5$, and y=[3x+a(valency of metallic element A)+b (valency of metallic element B)]/2.

3. A coating solution according to claim 1, wherein the alkoxymetal as said component (a) is formed from at least one of the alcohols represented by the general formula (II):

$$R^1OH \qquad (II)$$

where $R^1$ is a saturated or unsaturated hydrocarbon group having 1–6 carbon atoms.

4. A coating solution according to claim 1, wherein the β-diketone metal complex as said component (a) is formed from at least one of the β-diketones represented by the general formula (III):

$$R^2COCR^3HCOR^4 \qquad (III)$$

where $R^2$ is a saturated or unsaturated hydrocarbon group having 1–6 carbon atoms; $R^3$ is H or $CH_3$; and $R^4$ is an alkyl or alkoxyl group having 1–6 carbon atoms.

5. A coating solution according to claim 1, wherein the alcohol as component said (b) is at least one of the alcohols represented by the general formula (II):

$$R^1OH \qquad (II)$$

where $R^1$ is a saturated or unsaturated hydrocarbon group having 1–6 carbon atoms.

6. A coating solution according to claim 1, wherein the carboxylic anhydride as said component (b) is at least one of the carboxylic anhydrides represented by the general formula (IV):

$$R^5(CO)_2O \qquad (IV)$$

where $R^5$ is a divalent saturated or unsaturated hydrocarbon group having 1–6 carbon atoms.

7. A coating solution according to claim 1, wherein the glycol as said component (b) is at least one of the glycols represented by the general formula (V):

$$HOR^6OH \qquad (V)$$

where $R^6$ is a divalent saturated or unsaturated hydrocarbon group having 1–6 carbon atoms.

8. A coating solution according to claim 1, wherein the β-diketone as said component (b) is at least one of the β-diketones represented by the general formula (III):

$$R^2COCR^3HCOR^4 \qquad (III)$$

where $R^2$ is a saturated or unsaturated hydrocarbon group having 1–6 carbon atoms; $R^3$ is H or $CH_3$; and $R^4$ is an alkyl or alkoxyl group consisting 1–6 carbon atoms.

9. A coating solution according to claim 1, wherein the dicarboxylic acid monoester as said component (b) is at least one of the dicarboxylic acid monoesters represented by the general formula (VI):

$$R^7OCOR^8COOH \qquad (VI)$$

where $R^7$ is a saturated or unsaturated hydrocarbon group having 1–6 carbon atoms; $R^8$ is a divalent saturated or unsaturated hydrocarbon group having 1–6 carbon atoms.

10. A coating solution accordion to claim 1, in which said component (a) is subjected to a hydrolytic treatment with water either singly or in combination with catalyst before said component (a) is reacted with said component (b).

11. A coating solution according to claim 1, in which the product of reaction between said components (a) and (b) is subjected to a hydrolytic treatment with water either singly or in combination with a catalyst.

12. A dielectric thin film formed by applying the coating solution of claim 1 onto an electrode on a substrate and then baking the applied coating.

13. A dielectric thin film formed by applying the coating solution of claim 1 onto an electrode on a substrate, exposing the applied coating to a humidified atmosphere and then baking said coating.

14. A dielectric memory having an electrode formed on the dielectric thin film of claim 12.

15. A dielectric memory having an electrode formed on the dielectric thin film of claim 13.

16. A process for producing a dielectric thin film by the steps of (I) forming an electrode over a substrate, (II) applying a coating solution onto said electrode and (III) baking the applied coating, wherein said coating solution contains the reaction product of
   (a) at least one metal compound of Bi, at least one metal compound of metallic element A which is at least one member of the group consisting of Ca, Ba, Sr, Pb and Bi and at least one metal compound of metallic element B which is at least one member of the group consisting of Ti, Nb and Ta, said metal compounds being each independently in the form of either an alkoxymetal, a β-diketone metal complex or a metal acetate, with (b) at least one member of the group consisting of alcohols, carboxylic anhydrides, glycols, β-diketones and dicarboxylic acid monoesters.

17. A process for producing a dielectric memory by the steps of (I) forming an electrode over a substrate, (II) applying a coating solution onto said electrode, (III) baking the applied coating to form a dielectric thin film and (IV) forming a top electrode over said dielectric thin film, wherein said coating solution contains the reaction product of (a) at least one metal compound of Bi, at least one metal compound of metallic element A which is at least one member of the group consisting of Ca, Ba, Sr, Pb and Bi and at least one metal compound of metallic element B(which is at least one member of the group consisting of Ti, Nb and Ta, said metal compounds being each independently in the form of either an alkoxymetal, a β-diketone metal complex or a metal acetate, with (b) at least one member of the group consisting of alcohols, carboxylic anhydrides, glycols, β-diketones and dicarboxylic acid monoesters.

* * * * *

UNITED STATES PATENT AND TRADEMARK OFFICE
CERTIFICATE OF CORRECTION

PATENT NO. : 5,811,153
DATED : September 22, 1998
INVENTOR(S) : Akira Hashimoto, Yoshihiro Sawada, Tetsuya Osaka, Ichiro Koiwa, Juro Mita and Takao Kanehara It is certified that error appears in the above-identified patent and that said Letters Patent is hereby corrected as shown below:

Column 4, line 4, change "memory" to --thin film--.

Column 19, line 26, delete the word "face",

Column 20, line 15, delete the word "face".

line 17, after the word "dielectric" insert --thin--.

UNITED STATES PATENT AND TRADEMARK OFFICE
CERTIFICATE OF CORRECTION

PATENT NO.  : 5,811,153
DATED       : September 22, 1998
INVENTOR(S) : Akira Hashimoto, Yoshihiro Sawada, Tetsuya Osaka, Ichiro Koiwa, Juro Mita and Takao Kanehara It is certified that error appears in the above-identified patent and that said Letters Patent is hereby corrected as shown below:

Column 21, line 38, change "$2b \leq 5$" to read --$2 \leq b \leq 5$--.

Column 22, line 39, change "accordion" to --according--.

Column 24, line 5, delete " ( ".

Signed and Sealed this

Twentieth Day of April, 1999

Q. TODD DICKINSON

*Attest:*

*Attesting Officer*    Acting Commissioner of Patents and Trademarks